(12) United States Patent
Fuji (10) Patent No.: US 7,751,227 B2
(45) Date of Patent: *Jul. 6, 2010

(54) MEMORY DEVICE INCLUDING A PROGRAMMABLE RESISTANCE ELEMENT

(75) Inventor: Yukio Fuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/500,673

(22) Filed: Jul. 10, 2009

(65) Prior Publication Data

US 2009/0273970 A1 Nov. 5, 2009

Related U.S. Application Data

(63) Continuation of application No. 12/207,077, filed on Sep. 9, 2008, now Pat. No. 7,580,277, which is a continuation of application No. 11/333,344, filed on Jan. 18, 2006, now abandoned.

(30) Foreign Application Priority Data

Jan. 19, 2005 (JP) ............................. 2005-011626

(51) Int. Cl.
*G11C 11/00* (2006.01)
(52) U.S. Cl. ...................... 365/148; 365/210.1; 365/222
(58) Field of Classification Search ................ 365/148, 365/210.1, 222
See application file for complete search history.

(56) References Cited

U.S. PATENT DOCUMENTS 7,580,277 B2 * 8/2009 Fuji ........................... 365/148
2006/0056251 A1 3/2006 Parkinson

FOREIGN PATENT DOCUMENTS

| JP | 5-62469 A | 3/1993 |
|---|---|---|
| JP | 2002-197887 A | 7/2002 |
| JP | 2003-141873 A | 5/2003 |
| JP | 2004-086986 A | 3/2004 |
| JP | 2004-185753 A | 7/2004 |
| JP | 2004-362761 A | 12/2004 |

* cited by examiner

*Primary Examiner*—Hoai V Ho
(74) *Attorney, Agent, or Firm*—Sughrue Mion, PLLC (57) ABSTRACT

Disclosed are a phase change memory with improved retention characteristic of a phase change device, and a method for refreshing the phase change memory. The fact that a memory is a DRAM interface compatible memory is exploited. There are provided dummy cells stressed in accordance with the number of times of read and write operations. Changes in the resistance value of the dummy cells are detected by comparator circuits. If the resistance value have been changed beyond a predetermined reference value (that is, changed to a low resistance), a refresh request circuit requests an internal circuit, not shown, to effect refreshing. The memory cells and the dummy cells are transitorily refreshed and correction is made for variations in the programmed resistance value of the phase change devices to assure the margin as well as to improve retention characteristic.

17 Claims, 12 Drawing Sheets

MEMORY DEVICE INCLUDING A PROGRAMMABLE RESISTANCE ELEMENT

CROSS REFERENCE TO RELATED APPLICATIONS

This is a Continuation Application of U.S. application Ser. No. 12/207,077 filed Sep. 9, 2008, now U.S. Pat. No. 7,580,277 which is a Continuation of U.S. application Ser. No. 11/333,344 filed Jan. 18, 2006, which claims priority from JP 2005-011626 filed Jan. 19, 2005, now abandoned the contents of which are incorporated herein by reference.

FIELD OF THE INVENTION

This invention relates to a memory with a programmable resistor element (phase change memory).

BACKGROUND OF THE INVENTION

A phase change memory, as typical of a memory with a programmable resistor element, is a non-volatile memory taking advantage of characteristics e.g. of a chalcogenide material, such as Ge, Sb or Te that, when the chalcogenide material is heated, it takes on an amorphous state (high resistance)/crystalline state (low resistance). In general, the material undergoes a transition between the high resistance (reset) state and the low resistance (set) state, by the Joule's heat, generated by the electric current, depending on the time duration of current application.

In a phase change memory, the write time on the order of tens to about one hundred nanoseconds is said to be necessary. The number of times of repeated write operations is on the order of $10^{12}$, which is of the same order of magnitude as that of the FLASH memory (electrically programmable erasable non-volatile memory) and lower by about four orders of magnitude than that of the DRAM (dynamic random access memory).

With the phase change memory, there is a possibility that device characteristics are deteriorated to destruct stored data with increase in the number of times of repetition of read/write operations.

As a method for improving disturbance and retention characteristic of the above-described memory with a programmable resistor element, several proposals have been made in e.g. Patent Document 1 (U.S. Pat. No. 6,646,902B2) and Patent Document 2 (U.S. Pat. No. 6,560,155B1). An example disclosed in Patent Document 1 (U.S. Pat. No. 6,646,902B2) is now briefly described with reference to FIG. 11. The programmable resistor element, used in this technique, is of a structure comprised of a silver (Ag) containing solid electrolyte 1103, as an example, sandwiched between an upper electrode 1101 and a lower electrode 1102. When the potential is applied across the electrodes, Ag+ ions are generated on ionization and combined with electrons to yield metal Ag which is precipitated to interconnect the upper electrode 1101 and the lower electrode 1102 to establish a low resistance state. When the reverse potential is applied across the electrodes, the precipitated Ag metals are caused to disappear to establish the high resistance state. This method provides for variable resistance value across the electrodes.

Figure 11:
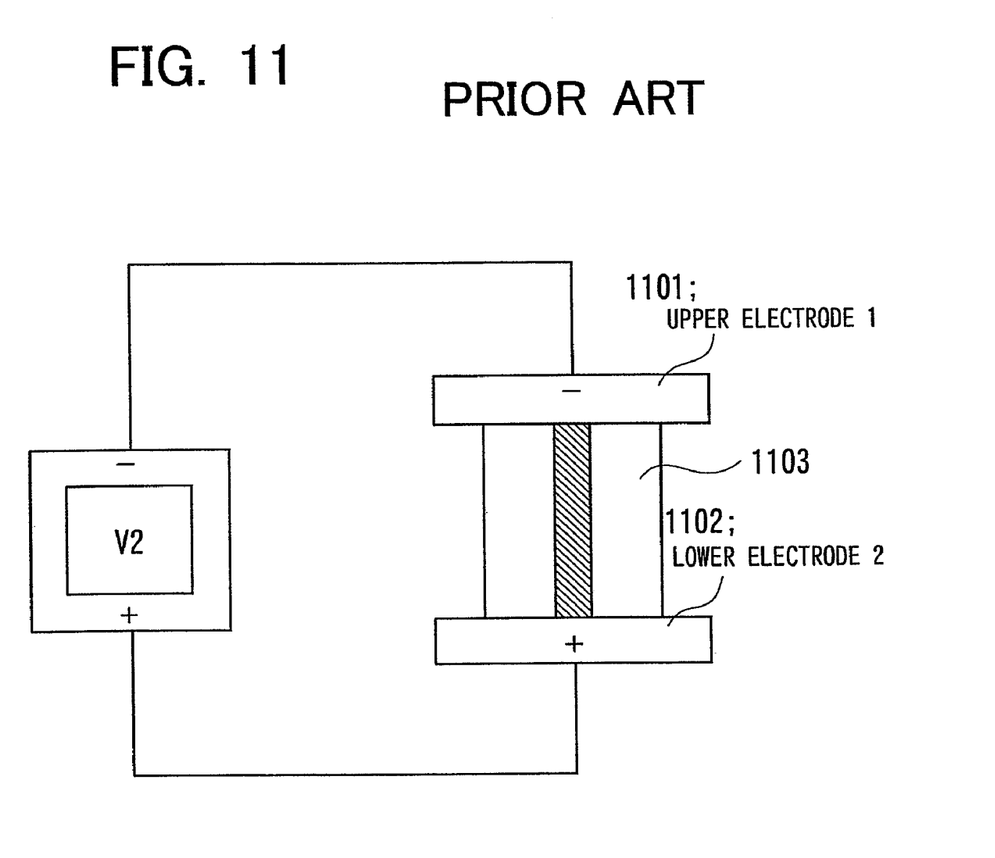
FIG. 11 shows the structure of memory cell electrodes and the applied voltage in the memory cell electrode structure of Patent Document 1.

With the structure of FIG. 11, the possible retention time of the programmed state is on the order of hours or days. Although the retention time is longer than with the DRAM, the retention characteristic is inferior as compared to that of the normal FLASH memory. With this in view, a proposal is made for applying a voltage V2 which would not cause disturbances as compared to the voltage VI at the time of programming (about 35 to 60% of VI) for improving the retention characteristic.

In the Patent Document 2 (U.S. Pat. No. 6,560,155B1), it is proposed to carry out a refreshing operation for presenting a DRAM interface compatible memory employing a memory cell similar to one shown in Patent Document 1 (U.S. Pat. No. 6,646,902B2).

It is proposed that, since the retention characteristic of the memory cell with a programmable resistor element is superior to that of the DRAM, the inner refresh timing of a DRAM is delayed by a delay circuit, and a voltage is periodically applied to improve retention characteristic as well as to reduce the refresh current and power.

Although the phase change device is a non-volatile memory device, the resistance value thereof is changed by the voltage and the current applied to the device by read disturbances to cause a change in the resistance value of the phase change device to deteriorate the retention characteristic and the read margin.

Figure 9:
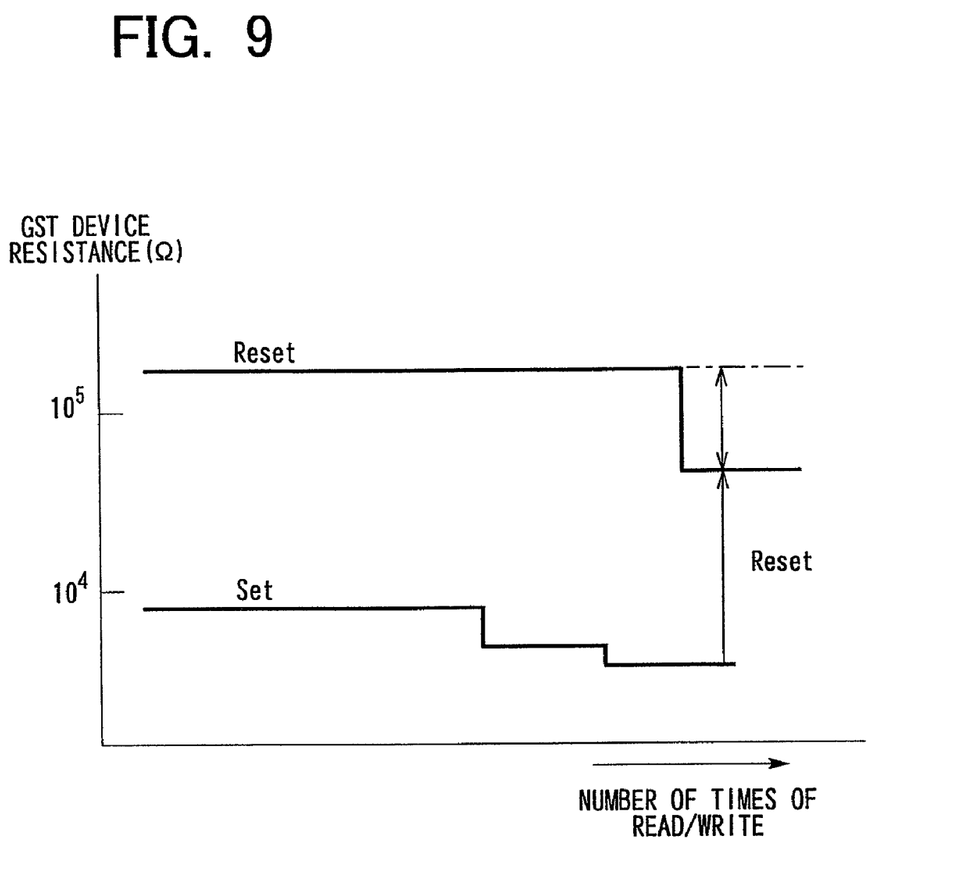
FIG. 9 shows changes in the resistance value of a conventional phase change device in write and read.

It has also been recognized that, during writing, the change in the resistance value is deteriorated in similar manner with time, as a result of application of the voltage and the current to the phase change device, due to disturbances similar to the read disturbances, as shown in FIG. 9. In this figure, showing a change in the resistance value of the phase change device during write and read, the abscissa and the ordinate denote the number of read/write times and the set/reset resistance value of the phase change device, respectively.

[Patent Document 1] U.S. Pat. No. 6,646,902 (U.S. Pat. No. 6,646,902B2)

[Patent Document 2] U.S. Pat. No. 6,560,155 (U.S. Pat. No. 6,560,155B1)

SUMMARY OF THE DISCLOSURE

For implementing a DRAM interface compatible memory product, using a phase change device, the following problems are encountered.

1) The number of times of repetitive write operations is on the order of $10^{12}$, which is of the same order of magnitude as that with the FLASH memory and lower by about four orders of magnitude than that of the DRAM. There are occasions where device characteristics are deteriorated with repetition of read and write operations, with the result that stored data are sometimes destroyed (see FIG. 9 described hereinabove).

Figure 10:
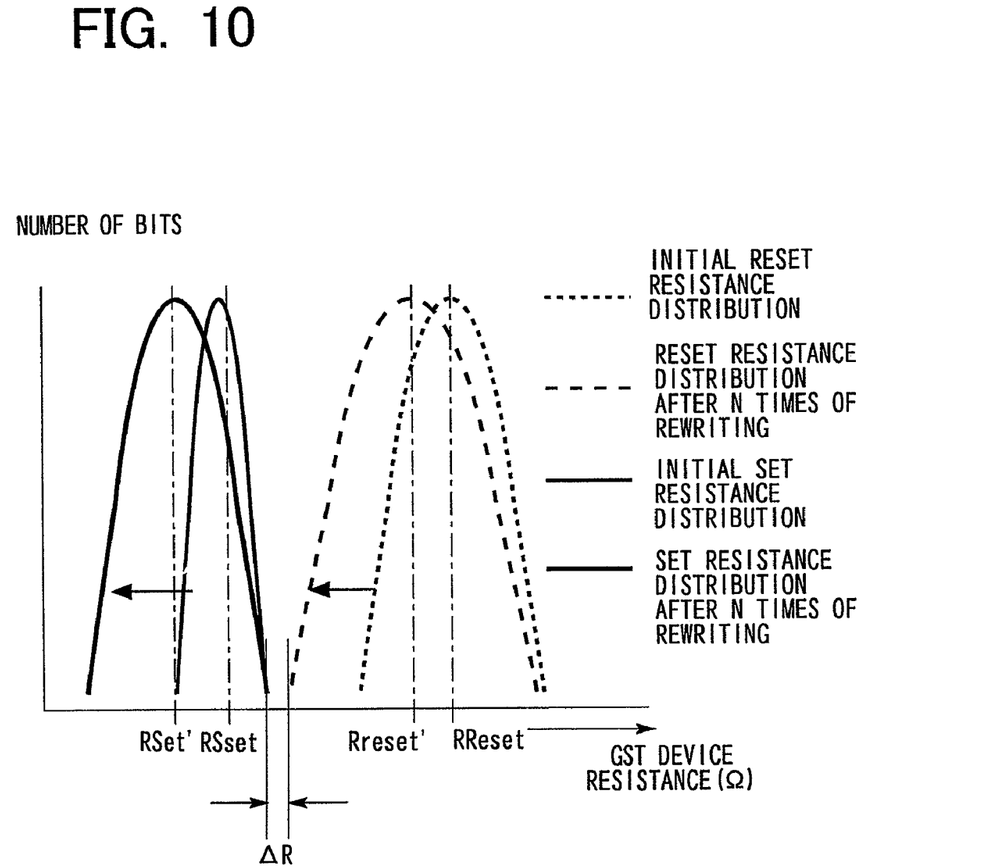
FIG. 10 shows changes and distribution of resistance value of a conventional phase change device in write and read.

2) In case the same data are repeatedly written in the same cell, such a problem may arise that the low resistance state becomes more deeply low, such that, even though the write operation has been made to a state of a high resistance, the high resistance state is not completely established (see FIG. 9). FIG. 10 shows change and the distribution of the resistance value of a conventional phase change device on write and read, and specifically shows initial reset resistance distribution (RReset), reset resistance distribution after n times of the write operations (Rreset'), initial set resistance distribution (RSset) and set resistance distribution after n times of the write operations (Rset').

In overwriting data, there is a possibility that status change is produced due to characteristics of a device of interest, and the resistance value is changed, with the result that resistance variations across the memory cells are increased, thus severely affecting the characteristics (see FIGS. 9 and 10). If read/write is simply repeated, the result is deteriorated retention characteristic, due to characteristics of the phase change device, such that the functions of a memory device cannot be demonstrated.

The present invention has been completed in view of the above problems. It is an object of the present invention to provide a memory device with improved retention characteristic of a phase change device.

The above object is attained by the present invention which is of the following general configuration.

The fact that the phase change memory of the present invention is a DRAM interface compatible memory is exploited. There are provided reference cells stressed in accordance with the number of times of read and write operations. A change in the resistance value of the reference cells is detected and, if the resistance value have been changed beyond a predetermined reference value (specifically, to a low resistance value), a refresh request is issued to an internal circuit, not shown, to refresh a memory cell and a reference cell transitorily. In this manner, correction is made for variations in the programmed resistance value of the phase change device to assure the margin as well as to improve retention characteristic.

In one aspect, the present invention provides a memory device comprising: a memory cell, including a programmable resistance element, at an intersection of a bit line and a word line, and a control circuit managing control for performing a refresh operation of the memory cell responsive to a change in resistance value of the memory cell.

In the memory device according to the present invention, changes in the resistance value of the phase change device of a dummy cell of interest, stressed in accordance with the number of times of read and write operations, are detected. If the resistance value of the phase change device of the dummy cell of interest has been changed beyond a predetermined reference value, a refresh request is issued to an internal circuit, and the memory and dummy cells are refreshed in accordance with the refreshing request.

In another aspect of the memory device according to the present invention, the number of times of read of a memory cell of interest, having a phase change device, may be counted and, when the number of times of read has reached a preset value, a refresh request may be issued to the internal circuit.

In another aspect of the memory device according to the present invention, first and second reference currents corresponding to first and second states of a memory cell having a phase change device may be compared with the current flowing through the memory cell, and a refresh request may be issued to an internal circuit when a predetermined offset (difference) has been produced in the current flowing through the memory cell to refresh the memory cells based on the refresh request.

In a further aspect, a method for refreshing in a memory device, according to the present invention, comprises the steps of:

detecting a change in a resistance value of a phase change device of a dummy cell stressed in accordance with the number of times of read;

issuing a refresh request to an internal circuit in the memory device in case the resistance value of the phase change device of said dummy cell has been changed beyond a predetermined reference value; and refreshing said memory cell and the dummy cell based on said refresh request.

A method for refreshing in a memory device, according to the present invention, comprises the steps of:

counting the number of times of read of a memory cell having a phase change device; and monitoring the number of times of read and issuing a refresh request to an internal circuit in the memory device when the number of times thus monitored has reached a preset value.

Preferably, in the method for refreshing a memory device according to the present invention, the memory device comprises:

a data register for holding data read from said memory cell at the time of refreshing, and a verification amplifier for comparing and detecting the data write state of said memory cell at the time of refreshing; wherein said method comprises the steps of reading data of said memory cell at the time of refreshing, temporarily transferring the data to a data register, referencing the value of said data register and writing only a cell of the first state to the second state; and setting data of the first state in the verification amplifier adapted for comparing and detecting the data write state in said memory cell; effecting writing to the first state out under verification reading; comparing the current with a predetermined resistance; discontinuing the writing for a cell where a predetermined resistance has been reached; and continuing writing for the other cell; and referencing the values of said data register in rewriting; effecting writing only in the cell of the second state to said second state.

A method for refreshing in a memory device, according to the present invention, comprises the steps of:

comparing first and second reference currents corresponding with first and second states of a memory cell having a phase change device, with the current flowing through said memory cell; and issuing a refresh request to an internal circuit when a predetermined offset has been produced in the current flowing through said memory cell; and refreshing said memory cell based on said refresh request.

Preferably, the method according to the present invention, further comprises the steps of:

reading cells in the first and second states;

overwriting the cell read to the second state if said cell is in the second state; writing the cell overwritten to the second state to the first state; and restoring the cell again to the second state of the normal current and voltage; and restoring the cell read to the second state if the cell is in the first state, and again rewriting the cell to the first state.

The meritorious effects of the present invention are summarized as follows.

According to the present invention, it is possible to correct variations in the programmed resistance value of the phase change devices to provide the margin as well as to improve retention characteristic.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will now be described. The memory device according to a mode for practicing the present invention includes a reference cell, stressed in accordance with the number of times of the phase change memory cell, and means for detecting a change in the resistance value of the phase change devices constituting the reference cell and issuing a refresh request to an internal circuit in case the resistance value has been changed beyond the set reference value (specifically, to a low resistance value), thereby improving data retention characteristic.

Figure 1:
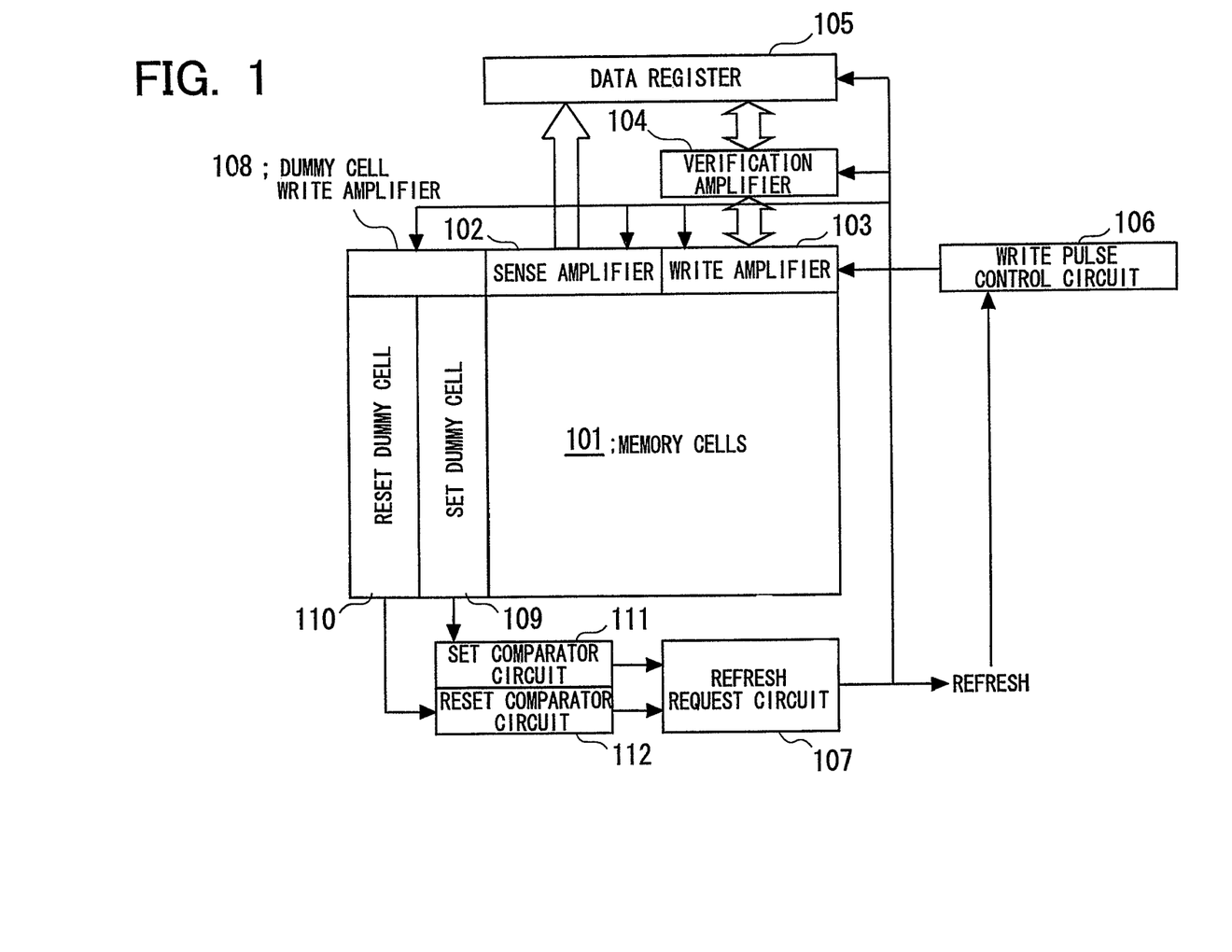
FIG. 1 is a diagram illustrating the configuration of an embodiment of the present invention.

Preferred embodiments of the present invention will be described with reference to the drawings. Referring to FIG. 1, a memory according to an embodiment of the present invention includes a memory cell 101, a sense amplifier 102 for sensing and amplifying data written in the memory cell 101, a write amplifier 103 for writing data in the memory cell 101, a data register 105 for retreating and storing data therein, and a verification amplifier 104 for comparing and detecting the state of data written in the memory cell at the refreshing time. The memory also includes a Set dummy cell 109, having a Set resistance programmed therein, a Reset dummy cell 110, having a Reset resistance programmed therein, a Set comparator circuit 111 for monitoring the resistance value of the Set dummy cell 109, and a Reset comparator circuit 112 for monitoring the resistance value of the Reset dummy cell 110. The memory further includes a refresh request circuit 107, a write pulse control circuit 106, and a dummy cell write amplifier 108. The refresh request circuit 107 decides the presence or absence of a refresh request from the results of comparison in the Set comparator circuit 111 and in the Reset comparator circuit 112 and makes a refresh request to an internal circuit. The write pulse control circuit 106 controls the write pulse at the time of program verification. The dummy cell write amplifier 108 simultaneously performs write operation to the dummy cells at the time of the refresh operation.

Figure 2:
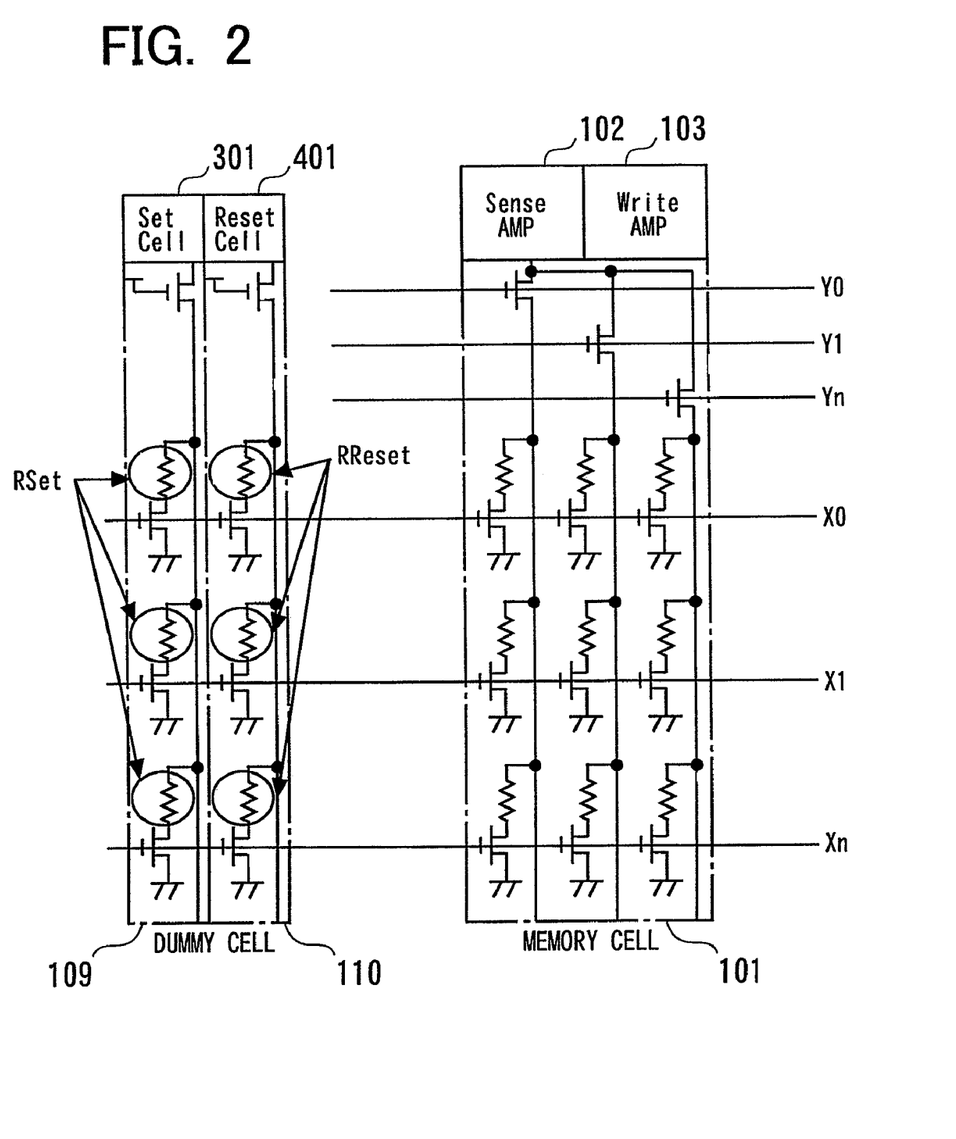
FIG. 2 is a diagram illustrating the circuit configuration of a memory cell and a dummy cell of an embodiment of the present invention.

FIG. 2 shows the circuit configuration of a memory cell, a dummy cell, a sense amplifier and a write amplifier.

Referring to FIG. 2, a plurality of memory cells 101 are arranged in an X/Y matrix configuration. A phase change device, schematically shown as a resistor element, is arranged between the source of a memory cell transistor and a bit line.

The phase change device is amorphized and presents a high resistance on heating on application of a high voltage plus a short pulse followed by quenching. The high resistance state is termed a 'Reset'. The phase change device is crystallized and presents a low resistance on being warmed for some time duration with a lower current and a longer pulse length. This low resistance state is termed a 'Set'.

In this manner, the phase change device is changed between the amorphous state and the crystalline state and is thereby changed in its resistance value to effect programming.

Similarly to the memory cell, the Set dummy cell 109 and the Reset memory cell 110 are written to the set state or to the reset state. These cells are arranged in memory cell areas, and have the word lines in common with the memory cells. There are provided bias circuits 302 and 402, shown in FIGS. 3 and 4, on the bit lines, so that the current stress will be applied to the bit lines at the time of memory cell selection.

At the same time as the dummy cells, connected to the selected word lines, are selected, similarly to the memory cells, and the read/write stress is applied to selected dummy cells, minor stresses are applied to non-selected cells due to charging/discharge of the capacitances stored on the bit lines. The stresses thus applied to the selected cell and to the non-selected cells are termed disturbances in the selected cell and disturbances in the non-selected cell, respectively.

Figure 3:
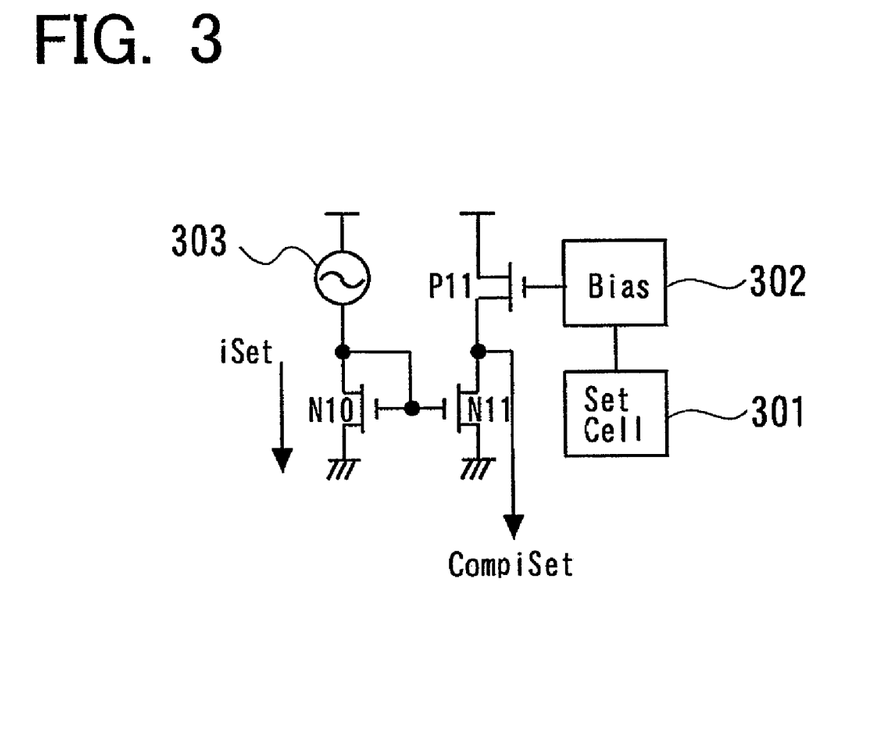
FIG. 3 is a diagram illustrating the circuit configuration of a comparator circuit for monitoring a Set resistance according to an embodiment of the present invention.
Figure 4:
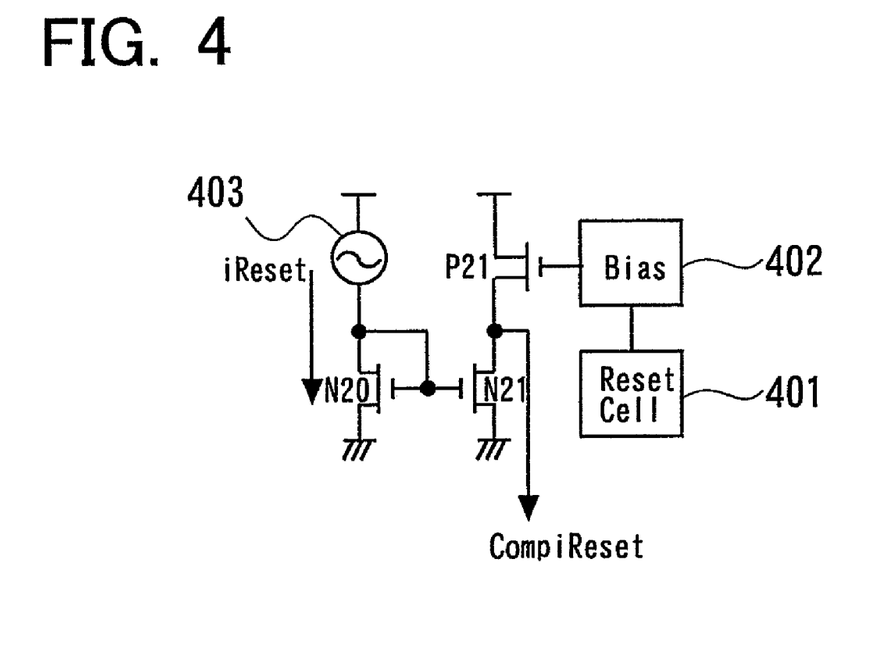
FIG. 4 is a diagram illustrating the circuit configuration of a comparator circuit for monitoring a Reset resistance according to an embodiment of the present invention.

FIGS. 3 and 4 show the configuration of comparator circuits for monitoring the resistance value of the dummy cells. Specifically, FIG. 3 is a diagram illustrating the configuration of a Set comparator circuit 111 for monitoring the resistance of the Set dummy cell. FIG. 4 is a diagram illustrating the configuration of a Reset comparator circuit 112 for monitoring the resistance of the Reset dummy cell.

For iSet and iReset, predetermined current values are set from constant current sources 303 and 403, respectively. For example, a resistance device other than the phase change device for setting the resistance value to be written in the Set cell 301 may be provided as reference resistance, and a constant current source may then be provided by biasing means.

It is assumed that the reference value is equal to the write resistance of the Set dummy cell, the write resistance of the memory cell and to the resistance of the biasing means.

If, in FIG. 3, if a current iSet is the reference current, a current equal to the reference current iSet flows through an NMOS transistor N10 connected to a constant current source 303. Since an NMOS transistor N10 and N10 constitute a current mirror circuit, the current iSet also flows through the NMOS transistor N11 as a mirror current.

If, on the other hand, the current is supplied to the Set dummy cell 109 by the bias circuit 302, connected to the Set dummy cell (set cell), a current of iSetCell, that is, a current flowing through the Set cell, flows through this PMOS transistor P11, because the bias circuit 302 and a PMOS transistor P11 constitute a current mirror circuit.

The PMOS transistor P11 and the NMOS transistor N11 constitute a ratio inverter, so that, in case iSet<iSetCell (the current iSet flowing through the Set cell is larger than the reference current iset), that is, if the resistance value of the phase change device of the Set dummy cell 109 has become lower than the predetermined resistance value, under the effect of the read disturbance or the write disturbance, a comparison result output CompiSet goes HIGH.

On the other hand, in case iSet>iSetCell, that is, the current iSetCell flowing through the Set cell is smaller than the reference current iSet, viz. if the resistance value of the phase change device of the Set dummy cell 109 has not become lower than the predetermined resistance value, under the effect of the read disturbance or the write disturbance, the comparison result output CompiSet outputs a LOW level.

An iReset monitor of FIG. 4 performs detection in a similar manner, such that in case iReset<iResetCell, that is, if the current iResetCell flowing through a Reset cell is larger than the reference current iReset, viz. in case the resistance value of the phase change device of the Reset dummy cell 110 has become lower than the predetermined resistance value, the comparison result output CompiReset becomes HIGH and in case iReset>iResetCell, that is, in case the current iResetCell flowing through a Reset cell is smaller than the reference current iReset, viz. in case the change in the resistance value of the phase change device of the Reset dummy cell 110 is small, the comparison result output CompiReset becomes LOW.

When an output of the Set comparator circuit 111 of FIG. 1 (CompiSet) is ORed with an output of the Reset comparator circuit 112 (CompiReset), and it is detected that an offset has been produced in one of them, the refresh request circuit 107 is activated to make a refresh request to an internal circuit (refresh control circuit).

In the comparator circuits 111 and 112, the ratio of the resistance of the biasing means, the reference resistance value and the write resistance is assumed to be 1:1:1. However, since a current mirror configuration is used, the current ratio may be suitably set by properly setting the W/L (channel width/channel length) ratio of the MOS transistors making up the current mirror. This provides for a margin taking variations into account to enable setting to an optimum value.

Figure 5:
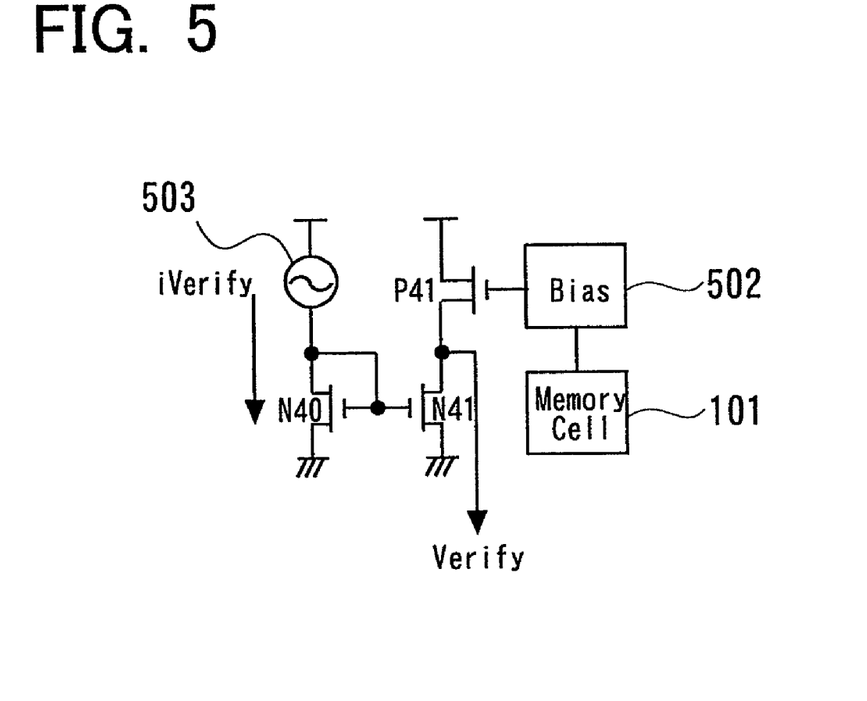
FIG. 5 is a diagram illustrating the circuit configuration of a verification amplifier according to an embodiment of the present invention.
Figure 6:
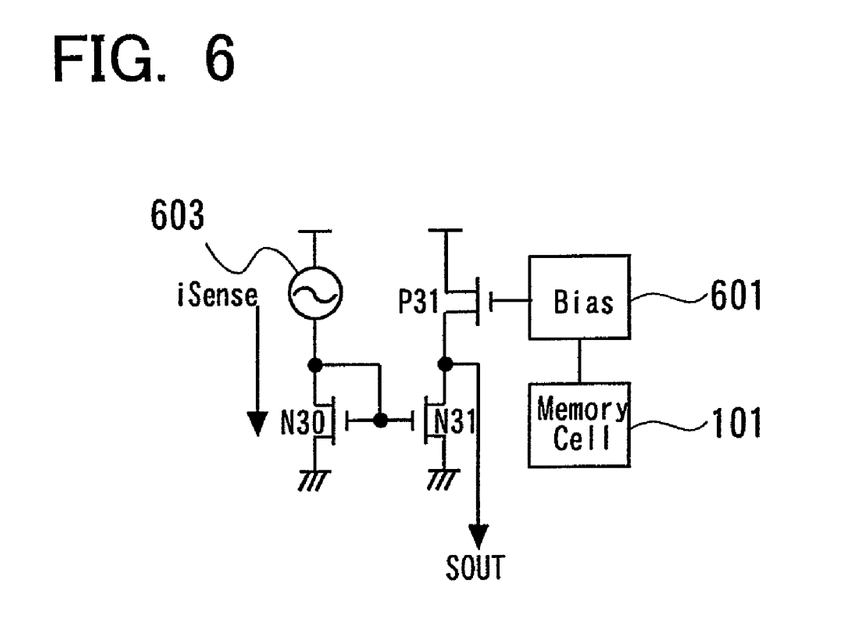
FIG. 6 is a diagram illustrating the circuit configuration of a sense amplifier according to an embodiment of the present invention.

FIGS. 5 and 6 show a circuit configuration of a verification amplifier 104 and a circuit configuration of a sense amplifier 102, respectively. The current values IVerify and iSense of constant current sources 503 and 603 are selected such that IVerify>iSense, so as to be used for verification and for normal read, respectively.

Figure 7:
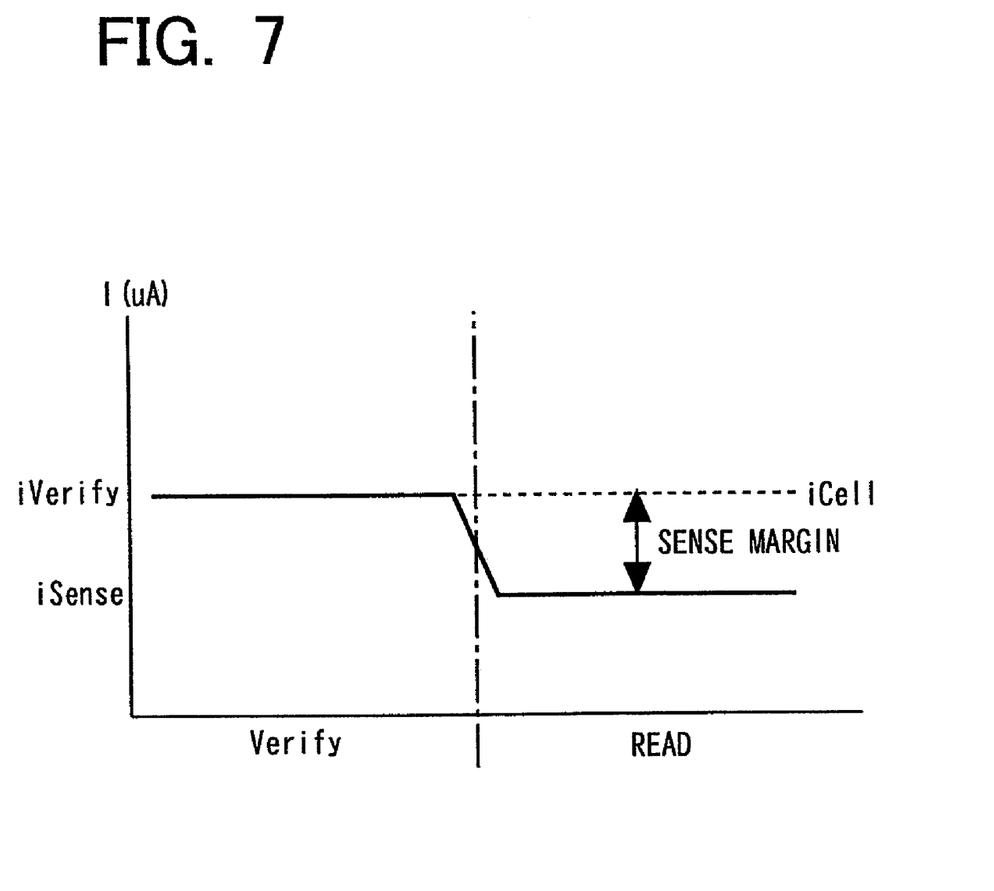
FIG. 7 shows the result of comparison of the verification current and the sense current according to an embodiment of the present invention.

The write resistance value for the memory cell and the dummy cell correspond to the reference current provided by iVerify and, in case of sensing (read), may be set so that the margin for iSense is on the order of one-half of iVerify, taking into account the variation as well as shown in FIG. 7. On the other hand, since the circuits of FIGS. 5 and 6 are in the current mirror configuration, the ratio may be changed to a proper value, depending on the transistor size.

As an embodiment of the present invention, an example of a system for the refresh operation will now be described.

Here, a Set cell and a Reset cell are defined as 1 and 0 of data, respectively.

1) The memory cell data of a refresh unit is set in the data register 105 and, after resetting the data of the verification amplifier 104, it is set to 1.

2) The cells of the refresh unit are all set to the Set state.

2)-1 Only the Set cells are set to a Reset state for the time being.

2)-2 The Reset cells are matched to the Set level by multi-stage writing.

In this matching method, the Reset cell undergo Set writes and verifications by the verification amplifier in plural stages. This operation is repeated until Pass is obtained, at which time the Set is completed with the Pass.

By the above operation, the cells are matched for the time being to the resistance value of the Set state of the reference current+α for taking the operating margin into account.

3) The value of the data register 105 is transferred to the verification amplifier 104 and the Reset is executed only for Reset cells.

4) If the result of the read and verification is all correct, the processing comes to a close.

In the present embodiment, writing is carried out in similar manner for the dummy cells, that is, Set dummy cells and Reset dummy cells.

Figure 8A:
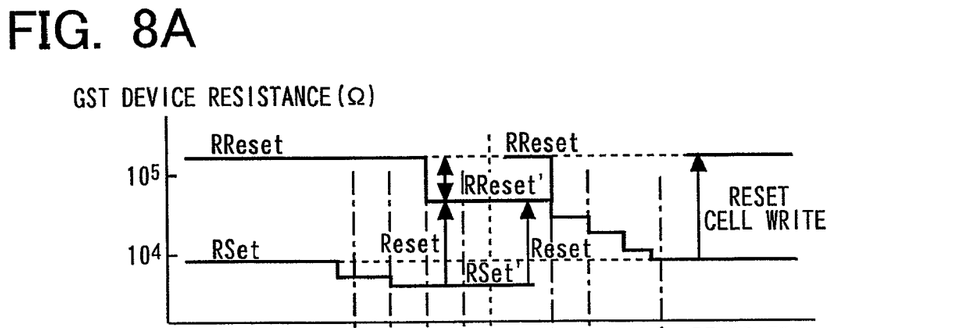
FIG. 8A shows the relation between the change in the device resistance value and the refresh according to an embodiment of the present invention and FIG. 8B shows the relation between the Set/Reset current/verification current of FIG. 8A and the pulse applied.
Figure 8B:
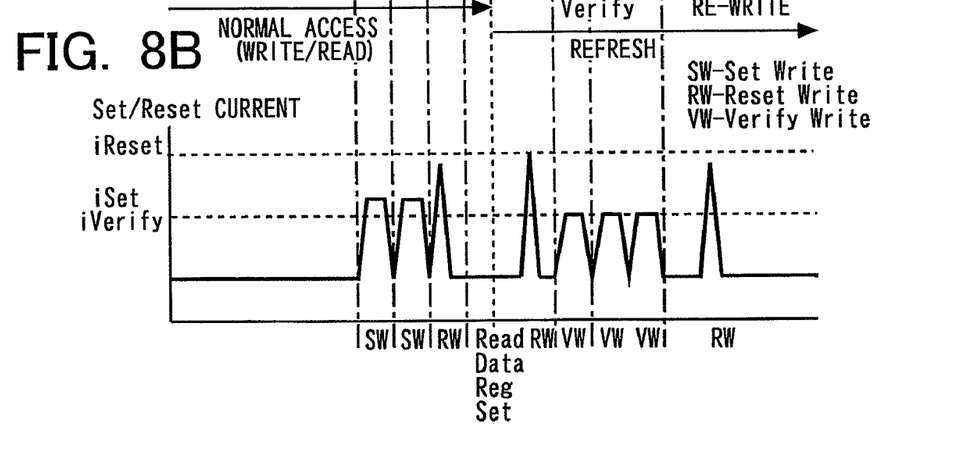

FIGS. 8A and 8B show changes in the resistance value of the Set/Reset cells in case a sequence of operations in accordance with an embodiment of the present invention has been carried out. In more detail, FIG. 8A schematically shows the change in the programmed resistance value of the memory cell and the dummy call and FIG. 8B schematically shows the current and the pulse width at the time of writing.

In the initial write state, the resistance value of the phase change device has been programmed in the RReset/Rset. In the normal access state, the write/read is carried out repeatedly.

In case the writing of the Set state (SW) is repeated with the iSet current with a long pulse, RSet falls to be in a 'Rset' state.

If next the Reset write (RW) is written in the same memory cell with a current of iReset with a short pulse, the resistance value does not revert to RReset and is reset to a low resistance value of RReset'.

At this time, a similar stress is applied to the dummy cell as well. If the comparator circuits 111 and 112 detect that the Set resistance or the Reset resistance has been lowered, the refresh request circuit 107 issues a refresh request.

The refresh operation is now initiated. That is, memory cell data are temporally read and transferred to the data register 105.

The value of the data register 105 is then referenced and Reset write is carried out only in the cells in the Set state.

The resistance value of the Reset cell, not stressed, is RReset, while that of the stressed device is RReset'.

Then, Verify write (VW) is carried out. In the verification amplifier 104, data '1' is set and Set write is carried out a plural number of times with the current iSet>iVerify as verify-read is carried out. The current value is lowered because it is expected that the effect of suppressing variations in the resistance value may be obtained by controlling the progressing rate of crystallization from the amorphous state.

The current is compared to the predetermined resistance value, by the verification amplifier 104. The writing is discontinued for cells where the predetermined resistance has been reached. For other cells, writing is carried out with addition. By so doing, the resistance of the Set cell may be matched to the RSet cell even if variations in the Reset resistance are produced.

In the present embodiment, the method for lowering the Set current value has been described. Alternatively, control may be by controlling the width or the time duration of application of the Set pulse.

For rewriting, data register values may be referenced to effect Reset only of the Reset cell to match the resistance value to RReset.

In the above-described examples, matching to the Set side is carried out once and Reset rewriting is carried out. However, matching on the Reset side and the rewriting to Set may also be effected by applying high voltage and large current to achieve the operation and effect similar to those described above.

In the present embodiment, the fact that the memory is DRAM interface compatible is exploited, there are provided the reference cell stressed in accordance with the number of times of read and write operations, a means for detecting a change in the resistance of the phase change device of the reference cell and for requesting an internal circuit to perform refresh operation in case the resistance value has been changed beyond a set reference value, and a means for counting the number of read operations and requesting the internal circuit to perform refresh operation in accordance with a predetermined number of times, or a means for detecting the difference of the reference current and the current flowing in the memory cell and requesting the internal circuit to perform refresh operation in case the resistance value has been changed beyond the predetermined reference value, are provided, and memory cells and the reference cells are temporarily refreshed or only the memory cell is refreshed to correct the variations of the phase change device. Hence, the variations in the programmed resistance value of the phase change device may be corrected to provide for a margin as well as to improve retention characteristic.

Figure 12:
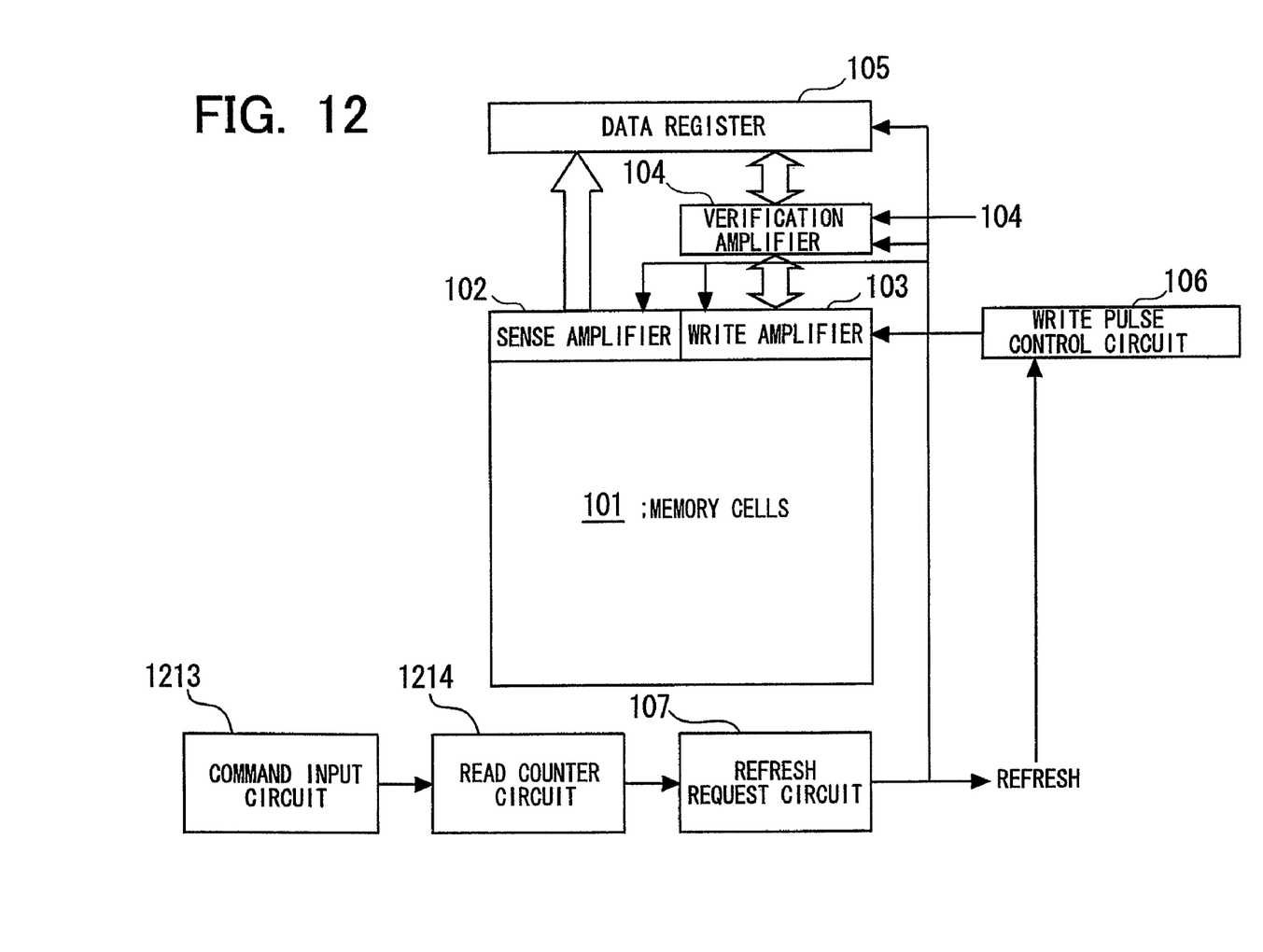
FIG. 12 is a diagram illustrating the configuration of a second embodiment of the present invention.

With reference to the drawings, a second embodiment of the present invention will now be described in detail. FIG. 12 is a diagram illustrating the configuration of the second embodiment of the present invention. Referring to FIG. 12, the number of times of read is counted by a counter 1214, with an inputting of a command at a command input circuit 1213 as a start point. When a preset number of times of the read operation has been made, a refresh request is made in a similar manner to effect memory cell refresh. In this case, similar meritorious effects may be achieved.

Figure 13:
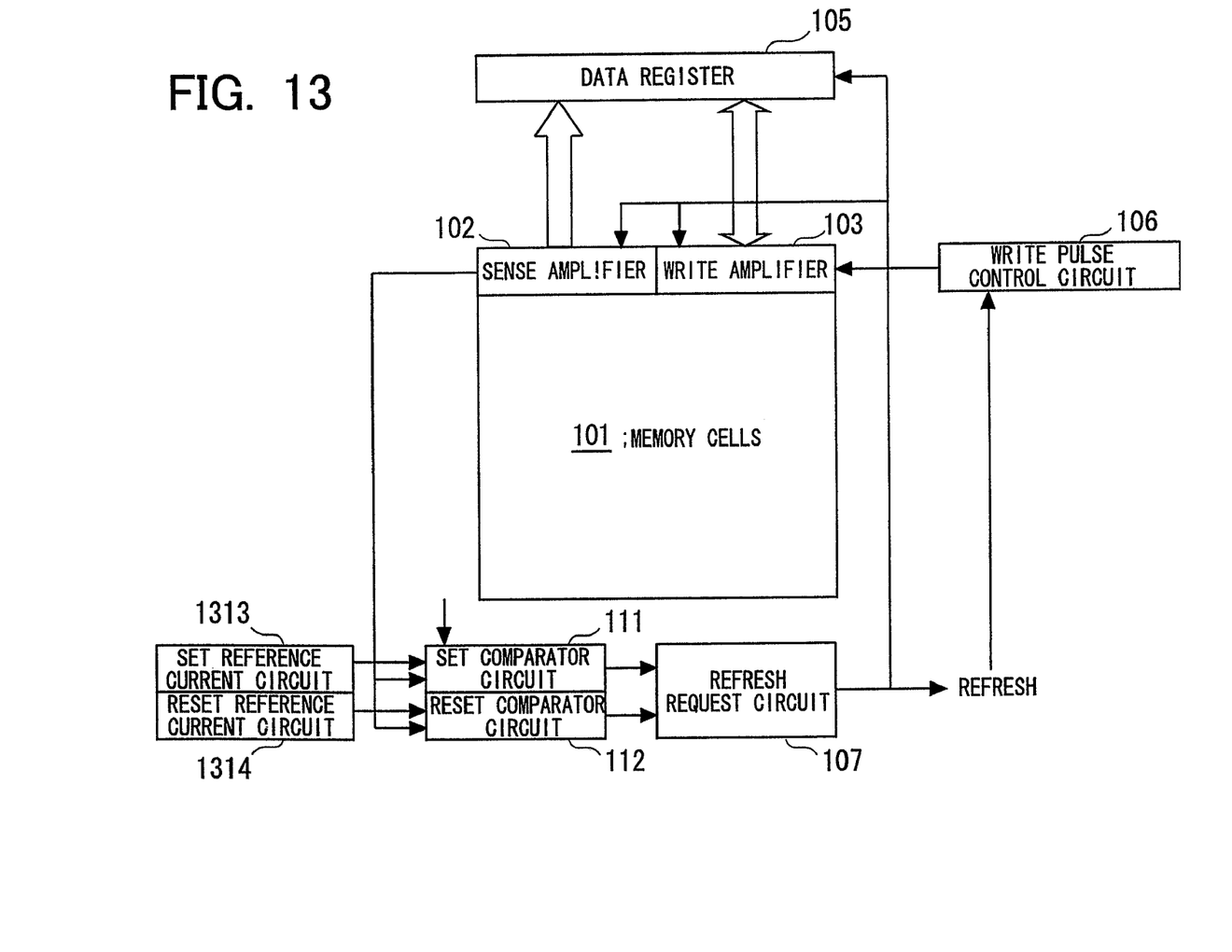
FIG. 13 is a diagram illustrating the configuration of a third embodiment of the present invention.

FIG. 13 is a diagram illustrating the configuration of a third embodiment of the present invention. In the present embodiment, in distinction from the first embodiment, no dummy cell is provided. In the read operation, the currents flowing through a Set reference current circuit 1313, produced from the reference current source, a Reset reference current circuit 1314 and through the memory cell, are compared and, in case a predetermined offset has been produced, a request is made for performing refresh operations to the internal circuit. The aforementioned refresh operations are carried out during the refresh period.

The refresh operation, described in the above embodiments, represents a technique whereby the resistances of the Reset/Set cells may be matched to a high accuracy. It is, however, time-consuming because the verifying operation has to be carried out simultaneously.

Figure 14A:
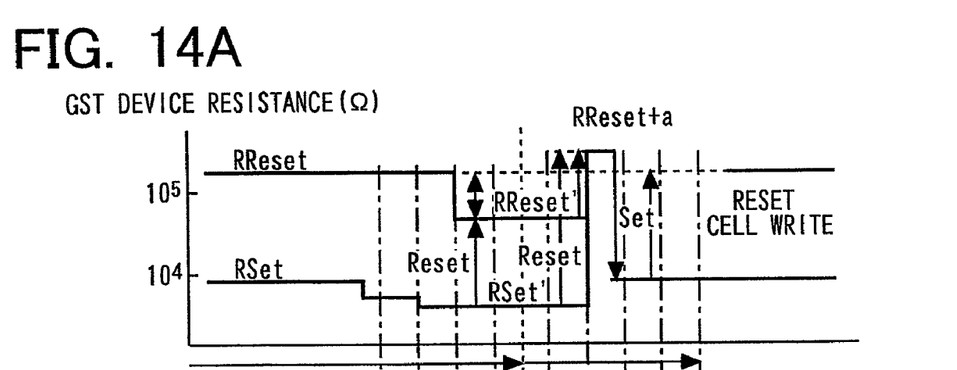
FIG. 14A shows the relation between changes in the device resistance value of the second embodiment and the refresh and FIG. 14B shows the relation between FIG. 14A and the Set/Reset current pulses.
Figure 14B:
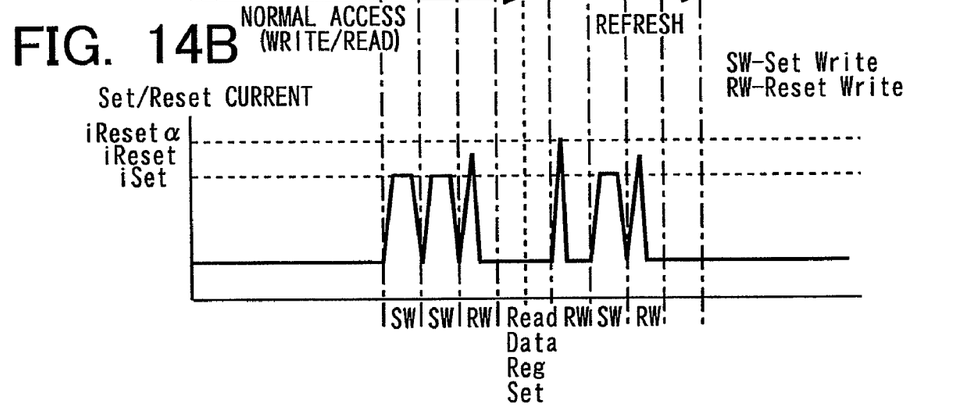

FIG. 14 shows an embodiment of a refreshing method for shortening the processing time. Referring to FIG. 14, this modified embodiment for the refreshing operation is such that a refresh request is verified by any of the refresh decision techniques of the aforementioned first to third embodiments and 1) Reset/Set cells are read; and 2) if the cell is the Reset cell, Reset overwrite is carried out by applying the current or the voltage larger than that at the time of the Reset operation to establish the high resistance state of RReset+α.

Here, the current equal to iReset+α is caused to flow and the crystal is fused by the Joule's heat to set an amorphous state of a higher resistance.

3) The Reset cell, thus rewritten, is written to a Set state (low resistance) and again restored to the Reset state of the normal current and voltage.

4) In case the cell is the Set cell, the current or the voltage larger than those for the normal Reset operation is applied to establish the high resistance state of RReset+α, after which the cell is again restored to the Set.

In general, the Reset time<Set time and, in the above-described refresh method, the Set operation needs to be carried out a number of times until the state of the memory cell reaches the predetermined Set level.

In the second refresh system, the processing may be finished with at least two Reset operations and one Set operation, and hence the refresh may be finished in a short time. However, the second refresh system is slightly inferior to the first refresh method as to the accuracy in matching the resistance value.

However, even with the second refreshing method, variations from the predetermined resistance value may be detected to proceed to the correction of the resistance value, so that it is possible to improve retention characteristic at issue.

In the above embodiments, matching is once carried out on the whole to the Reset side, however matching may be made to the Set side and the resistance may then be matched to the RReset, with the large current, after which rewriting may be made on the Set side. In this case, the operation and effect comparable to those described above may be achieved.

Although the present invention has been described in the foregoing with reference to the above-described embodiments, the present invention is not limited to the configuration of these embodiments, and a variety of changes or correction that would occur to those skilled in the art may naturally be attempted without departing from the scope of the invention.

It should be noted that other objects, features and aspects of the present invention will become apparent in the entire disclosure and that modifications from the disclosed embodiments may be done without departing the scope of the present invention claimed as appended herewith.

Also it should be noted that any combination of the disclosed and/or claimed elements, matters and/or items may fall under the modifications aforementioned.

What is claimed is:

1. A method of refreshing a memory device comprising:
counting a number of times of read operation of the memory device, wherein the memory device comprising a plurality of memory cells, each of memory cells including a programmable resistance element;
issuing a refresh operating signal when the number of times of read operation has reached a predetermined value; and
refreshing all memory cells.

2. The method according to claim 1, wherein counting a number of times of read operation is carried out by counting a number of times of read command being input to a command input circuit of the memory device.

3. The method according to claim 1, wherein the programmable resistance element comprises a phase change material.

4. The method according to claim 1, further comprising: holding high/low resistance data transferred from each of the memory cells by using a data register at the time of refreshing.

5. The method according to claim 4, further comprising:
setting all memory cells of a refresh unit to low resistance state after holding high/low resistance data by the data register;
referring to high/low resistance data of each of memory cells, wherein the high/low resistance data are holding by the data register; and
setting memory cells which respond to holding high resistance in the data register to high resistance state.

6. The method according to claim 4, further comprising:
setting all memory cells of a refresh unit to high resistance state after holding high/low resistance data by the data register;
referring to high/low resistance data of each of memory cells, wherein the high/low resistance data are holding by the data register; and
setting memory cells which respond to holding low resistance in the data register to low resistance state.

7. The method according to claim 1, further comprising: detecting a data write state in each of the memory cells at the time of refreshing by using a verification amplifier.

8. The method according to claim 7, wherein the verification amplifier compares a resistance of each of the memory cells with a predetermined resistance value at the time of refreshing.

9. A method of refreshing a memory device comprising:
storing data to memory cells based on a high/low resistance of each of the memory cells;
applying a first stress to a first dummy cell which monitors a high resistance of the memory cells, wherein the first stress is same as a current stress being applied to one of the memory cells which is set to the high resistance;
applying a second stress to a second dummy cell which monitors a low resistance of the memory cells, wherein the second stress is same as a current stress being applied to one of the memory cells which is set to the low resistance; and
issuing a refresh operating signal in response to a change of the resistance of the first dummy cell or the second dummy cell; and
refreshing the memory cells, the first dummy cell and the second dummy cell.

10. The method according to claim 9, wherein the high/low resistance of the memory cell corresponds to a change in the crystal state of a phase change material.

11. The method according to claim 9, wherein the refresh operating signal is issued when the resistance of the first dummy cell is out of a predetermined first value or the resistance of the second dummy cell is out of a predetermined second value.

12. The method according to claim 9, wherein the first dummy cell, the second dummy cell and the memory cells which monitored by both the first dummy cell and the second dummy cell are selected by a same word line at the time of write and read operation.

13. The method according to claim 9, further comprising: holding high/low resistance data transferred from each of the memory cells by using a data register at the time of refreshing.

14. The method according to claim 13, further comprising:
setting all memory cells of a refresh unit to low resistance state after holding high/low resistance data by the data register;
referring to high/low resistance data of each of memory cells, wherein the high/low resistance data are holding by the data register; and
setting memory cells which respond to holding high resistance in the data register to high resistance state.

15. The method according to claim 13, further comprising:
setting all memory cells of a refresh unit to high resistance state after holding high/low resistance data by the data register;
referring to high/low resistance data of each of memory cells, wherein the high/low resistance data are holding by the data register; and
setting memory cells which respond to holding low resistance in the data register to low resistance state.

16. The method according to claim 9, further comprising:
detecting a data write state in each of the memory cells at the time of refreshing by using a verification amplifier.

17. The method according to claim 16, wherein the verification amplifier compares a resistance of each of the memory cells with a predetermined resistance value at the time of refreshing.

* * * * *